United States Patent
Wang et al.

(10) Patent No.: US 11,962,066 B2
(45) Date of Patent: Apr. 16, 2024

(54) TERMINAL DEVICE

(71) Applicant: VIVO MOBILE COMMUNICATION CO., LTD., Guangdong (CN)

(72) Inventors: Yijin Wang, Dongguan (CN); Xianjing Jian, Dongguan (CN)

(73) Assignee: Vivo Mobile Communication Co., Ltd., Dongguan (CN)

( * ) Notice: Subject to any disclaimer, the term of this patent is extended or adjusted under 35 U.S.C. 154(b) by 575 days.

(21) Appl. No.: 17/155,156

(22) Filed: Jan. 22, 2021

(65) Prior Publication Data

US 2021/0151852 A1 May 20, 2021

Related U.S. Application Data

(63) Continuation-in-part of application No. PCT/CN2019/096683, filed on Jul. 19, 2019.

(30) Foreign Application Priority Data

Jul. 24, 2018 (CN) .......................... 201810820514.X

(51) Int. Cl.
*H01Q 1/22* (2006.01)
*H05K 5/00* (2006.01)
(Continued)

(52) U.S. Cl.
CPC .............. *H01Q 1/2266* (2013.01); *H01Q 1/22* (2013.01); *H05K 5/00* (2013.01); *H05K 5/0086* (2013.01);
(Continued)

(58) Field of Classification Search
CPC ...... H01Q 1/2266; H01Q 1/22; H05K 5/0086; H05K 5/0247; H05K 5/0286; H05K 5/04; H05K 5/02; H05K 5/00
(Continued)

(56) References Cited

U.S. PATENT DOCUMENTS 8,754,822 B1    6/2014 Dou
2009/0270146 A1  10/2009 Hirai
(Continued)

FOREIGN PATENT DOCUMENTS

CN    1266293 A    9/2000
CN    101427420 A    5/2009
(Continued)

OTHER PUBLICATIONS

Supplementary European Search Report regarding International Patent Application No. EP19840914.6, PCT/CN2019096683, dated Jul. 7, 2021.
(Continued)

Primary Examiner — Hai V Tran
(74) Attorney, Agent, or Firm — Harness, Dickey & Pierce, P.L.C.

(57) ABSTRACT

A terminal device includes a metal frame. At least two slots are provided on one side of the metal frame; at least two antenna feed points are provided on an inner side wall of the metal frame, and different antenna feed points in the at least two antenna feed points are located on sides of different slots. The terminal device is further provided therein with a signal reflecting wall, and there is a gap between the signal reflecting wall and the at least two slots. The signal reflecting wall is formed by a metal wall of a battery compartment of the terminal device, and the signal reflecting wall is a reflective curved surface that is convex. The metal frame and the signal reflecting wall are electrically connected with a ground plate in the terminal device.

14 Claims, 6 Drawing Sheets

(51) Int. Cl.
*H05K 5/02* (2006.01)
*H05K 5/04* (2006.01)

(52) U.S. Cl.
CPC .............. *H05K 5/02* (2013.01); *H05K 5/0247* (2013.01); *H05K 5/0286* (2013.01); *H05K 5/04* (2013.01)

(58) Field of Classification Search
USPC .......................................................... 343/872
See application file for complete search history.

(56) References Cited

U.S. PATENT DOCUMENTS

| | | | |
|---|---|---|---|
| 2010/0156721 | A1 | 6/2010 | Alamouti et al. |
| 2011/0012805 | A1* | 1/2011 | Huang ............... H01Q 3/24 343/893 |
| 2013/0285869 | A1 | 10/2013 | Chung et al. |
| 2014/0078008 | A1* | 3/2014 | Kang ............... H01Q 1/243 343/702 |
| 2014/0320355 | A1 | 10/2014 | Saito et al. |
| 2017/0201011 | A1 | 7/2017 | Khripkov et al. |
| 2019/0006739 | A1* | 1/2019 | Yu ............... H01Q 15/18 |
| 2019/0027808 | A1* | 1/2019 | Mow ............... H04R 5/04 |
| 2019/0214708 | A1 | 7/2019 | Ouyang et al. |
| 2019/0267718 | A1* | 8/2019 | Rajagopalan ......... H01Q 1/523 |
| 2020/0014119 | A1* | 1/2020 | Kim ............... H01Q 13/16 |

FOREIGN PATENT DOCUMENTS

| | | |
|---|---|---|
| CN | 102544748 A | 7/2012 |
| CN | 202475503 U | 10/2012 |
| CN | 103221896 A | 7/2013 |
| CN | 103947043 A | 7/2014 |
| CN | 104659463 A | 5/2015 |
| CN | 104701602 A | 6/2015 |
| CN | 105490035 A | 4/2016 |
| CN | 105789904 A | 7/2016 |
| CN | 205811051 U | 12/2016 |
| CN | 106454608 A | 2/2017 |
| CN | 206076482 U | 4/2017 |
| CN | 106785384 A | 5/2017 |
| CN | 106935962 A | 7/2017 |
| CN | 206370500 U | 8/2017 |
| CN | 206412466 U | 8/2017 |
| CN | 107317097 A | 11/2017 |
| CN | 108110417 A | 6/2018 |
| CN | 108270080 A | 7/2018 |
| CN | 207624903 U | 7/2018 |
| CN | 108987905 A | 12/2018 |
| CN | 108987906 A | 12/2018 |
| CN | 108987944 A | 12/2018 |
| CN | 108987945 A | 12/2018 |
| EP | 1033779 A2 | 9/2000 |
| EP | 1418642 A2 | 5/2004 |
| EP | 2606407 A2 | 6/2013 |
| WO | WO-2008050854 A1 | 5/2008 |
| WO | WO-2018126563 A1 | 7/2018 |

OTHER PUBLICATIONS

First Office Action regarding Chinese Patent Application No. 201810820514.X, dated Apr. 24, 2020. Translation provided by Bohui Intellectual Property.

Notification to Grant Patent Right for Invention regarding Chinese Patent Application No. 201810820514.X, dated Jul. 6, 2020. Translation provided by Bohui Intellectual Property.

International Search Report and Written Opinion of the International Searching Authority regarding International Patent Application No. PCT/CN2019/096683, dated Oct. 22, 2019. Translation provided by Bohui Intellectual Property.

* cited by examiner

TERMINAL DEVICE

CROSS-REFERENCE TO RELATED APPLICATION

This application is a Bypass Continuation-in-part Application of PCT/CN2019/096683 filed Jul. 19, 2019, which claims priority to Chinese Patent Application No. 201810820514.X, filed in China on Jul. 24, 2018, titled "TERMINAL DEVICE", which are incorporated herein by reference in their entirety.

TECHNICAL FIELD

The present disclosure relates to the field of communications technologies, and more particularly, to a terminal device.

BACKGROUND

With rapid development of communication technology, multi-antenna communication has become a mainstream and a future development trend of terminal devices, and in this process, millimeter wave antennas are gradually introduced to terminal devices.

SUMMARY

Some embodiments of the present disclosure provide a terminal device, which includes a metal frame. At least two slots are provided in one side of the metal frame; at least two antenna feed points are provided on an inner side wall of the metal frame, and different antenna feed points in the at least two antenna feed points are located on sides of different slots. The terminal device is further provided therein with a signal reflecting wall, and there is a gap between the signal reflecting wall and the at least two slots. The signal reflecting wall is formed by a metal wall of a battery compartment of the terminal device, and the signal reflecting wall is a reflective curved surface that is convex. The battery compartment is a structure that accommodates a battery of the terminal device. The metal frame and the signal reflecting wall are electrically connected with a ground plate in the terminal device.

BRIEF DESCRIPTION OF THE DRAWINGS

In order to describe technical solutions in some embodiments of the present disclosure more clearly, accompanying drawings to be used in the description of some embodiments of the present disclosure will be introduced briefly. Obviously, the accompanying drawings to be described below are merely some embodiments of the present disclosure, and a person of ordinary skill in the art can obtain other drawings according to those drawings.

DETAILED DESCRIPTION

The technical solutions in some embodiments of the present disclosure will be described clearly with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art shall be included in the protection scope of the present disclosure.

The term "and/or" herein is merely used to describe an association relationship of associated objects, which represents three kinds of relationships. For example, the phrase "A and/or B" represents three conditions: A exists alone, both A and B exist, and B exists alone. In addition, the character "/" herein generally indicates that the associated objects are in an "or" relationship. The character "/" in a formula indicates that the associated objects are in a "division" relationship. The term "plurality" herein means two or more unless otherwise specified.

In the related art, the millimeter wave antenna is generally in a form of an independent antenna module, and therefore an accommodating space needs to be provided for the independent antenna module in the terminal device. Consequently, an overall size of the terminal device is relatively large, resulting in a relatively low overall competitiveness of the terminal device.

Figure 1:
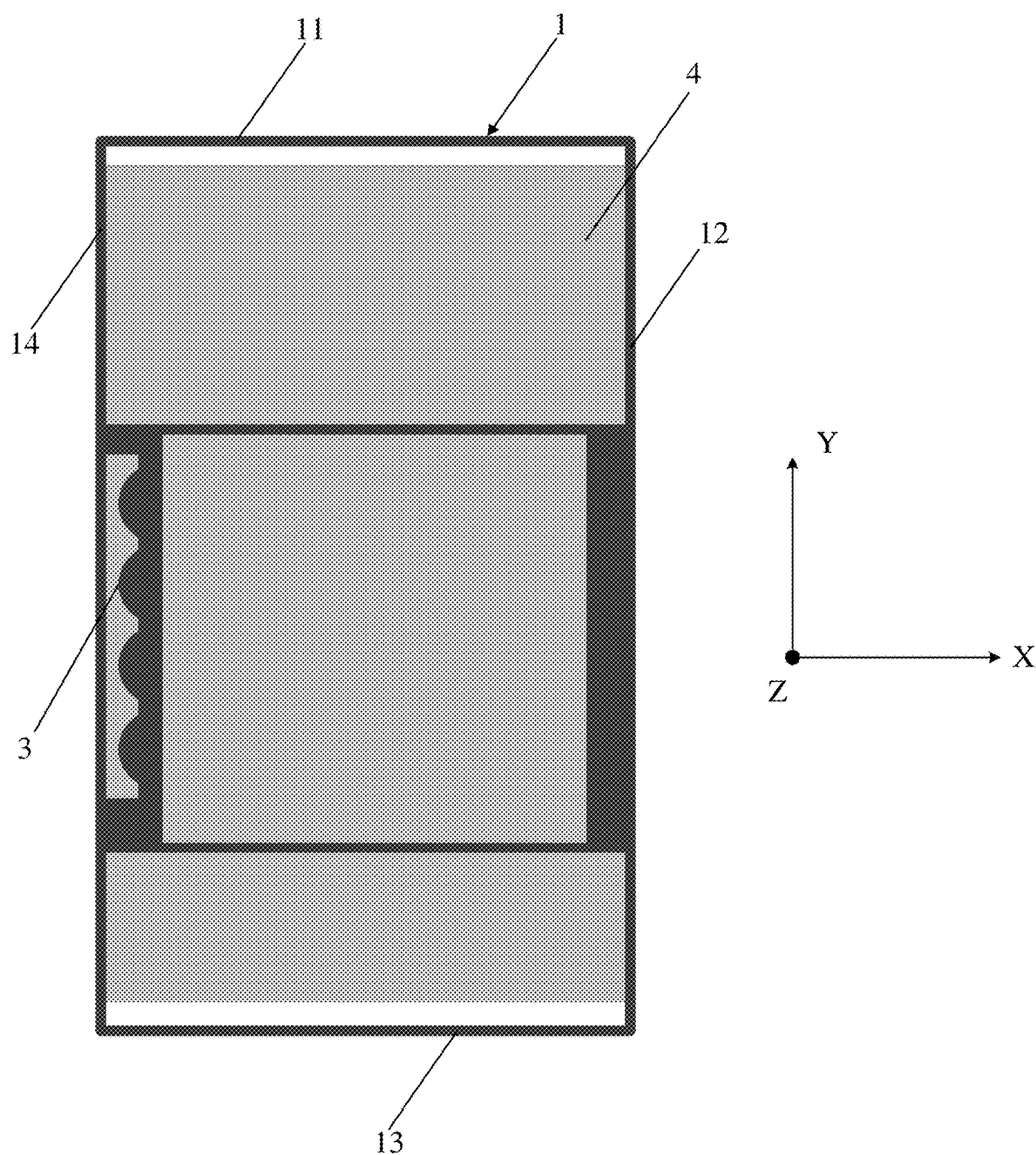
FIG. 1 is a first schematic diagram showing a structure of a terminal device, in accordance with some embodiments of the present disclosure.

FIG. 1 is a schematic diagram showing a structure of a terminal device provided in some embodiments of the present disclosure. As shown in FIG. 1, the terminal device includes a metal frame 1. At least two slots 15 are provided in one side of the metal frame 1. At least two antenna feed points 2 are provided on an inner side wall of the metal frame 1, and different antenna feed points 2 in the at least two antenna feed points 2 are located on sides of different slots 15. The terminal device is further provided therein with a signal reflecting wall 3, and there is a gap between the signal reflecting wall 3 and the at least two slots 15. The signal reflecting wall 3 is formed by a metal wall of a battery compartment of the terminal device, and the signal reflecting wall 3 is a reflective curved surface that is convex. The battery compartment is a structure that accommodates a battery of the terminal device. The metal frame 1 and the signal reflecting wall 3 are electrically connected to a ground plate 4 in the terminal device.

In some embodiments of the present disclosure, the metal frame 1 may be a frame in which parts are connected end to end or not connected, and the metal frame 1 may include a first side 11, a second side 12, a third side 13, and a fourth side 14. The at least two slots 15 may be provided in one side of the metal frame 1; or, at least two slots 15 may be provided in both of two opposite sides of the metal frame 1. An inside of the slot 15 may be filled with air, or may be filled with a non-conductive material, etc.

In some embodiments of the present disclosure, at least two antenna feed points 2 are provided on the inner side wall of the metal frame 1, and different antenna feed points 2 in the at least two antenna feed points 2 are located on the sides of different slots 15. In this way, it may be ensured that at least two slots 15 in one side of the metal frame 1 have an antenna feed point 2, so that the at least two slots 15 can form a millimeter wave array antenna. The antenna feed points 2 of the millimeter wave array antenna are all located on the sides of the slots 15, so that a millimeter wave signal may be led to the antenna feed points 2 of the millimeter wave array antenna and radiated through the metal frame 1. Besides, the metal frame 1 can also receive millimeter wave signals. Of course, optionally, an antenna feed point 2 may be provided for each slot 15.

In some embodiments of the present disclosure, due to existence of the signal reflecting wall 3, a performance of the millimeter wave array antenna may be enhanced, and a gain of the millimeter wave array antenna may be improved. There is a gap between the signal reflecting wall 3 and the at least two slots 15, and the gap may be filled with air, or may be filled with a non-conductive material, etc.

In some embodiments of the present disclosure, a size of a frame of the battery compartment in a length direction of the terminal device may be relatively wide. The signal reflecting wall 3 is a reflective curved surface that is convex. It may be that a large reflective curved surface corresponds to a plurality of slots 15, or it may be that a plurality of small reflective curved surfaces correspond to a plurality of slots 15, and so forth. The terminal device is generally provided with the battery compartment. Therefore, the metal wall of the battery compartment can be directly used as the signal reflecting wall 3, thereby avoiding the use of additional materials and saving the cost of the terminal device.

In some embodiments of the present disclosure, the battery compartment may be arranged above the ground plate 4, and the metal wall of the battery compartment serves as the signal reflecting wall 3 of the millimeter wave array antenna. The ground plate 4 may be a circuit board or a metal inner shell or the like. The metal frame 1 and the signal reflecting wall 3 are electrically connected to the ground plate 4 in the terminal device, so that the metal frame 1 and the signal reflecting wall 3 can be grounded.

As such, providing at least two slots 15 in one side of the metal frame 1 of the terminal device is equivalent to forming a millimeter wave array antenna, thereby saving the accommodating space for the millimeter wave array antenna and preventing it from occupying the space of other antennas, reducing a size of the terminal device, and improving the overall competitiveness of the terminal device. In some embodiments of the present disclosure, a structure of the terminal device is fully utilized to form the antenna, which improves a communication effect without affecting a metal texture of the terminal device. Moreover, by directly using the metal wall of the battery compartment as the signal reflecting wall 3, it may be possible to enhance the performance of the millimeter wave array antenna, improve the gain of the millimeter wave array antenna, and optimize a directional gain pattern of the array antenna. Since there is no need to use additional materials, the cost of the terminal device may be saved. In addition, the millimeter wave array antenna can be integrated into communication antennas in the related art, such as 2G, 3G, 4G or sub 6G, without affecting a communication quality of the communication antennas and functions of the terminal device.

In addition, in the current mainstream design of millimeter wave antennas, it is often difficult to achieve better antenna performance under a metal exterior design. That is, it is difficult to support the metal exterior design, resulting in lower product competitiveness. The design of this embodiment can better support the metal exterior design, and is compatible with the solution of using an exterior metal as other antennas, which improves the overall competitiveness of the product. While solving the problem that the overall size of the terminal device is relatively large because an accommodating space needs to be provided for a millimeter wave antenna in the terminal device, the design of this embodiment also solves the problem that it is difficult for the terminal device to support the design of a metal exterior.

In some embodiments of the present disclosure, the terminal device may be a mobile phone, a tablet personal computer, a laptop computer, a personal digital assistant (PDA), a mobile Internet device (MID), or a wearable device.

Figure 2:
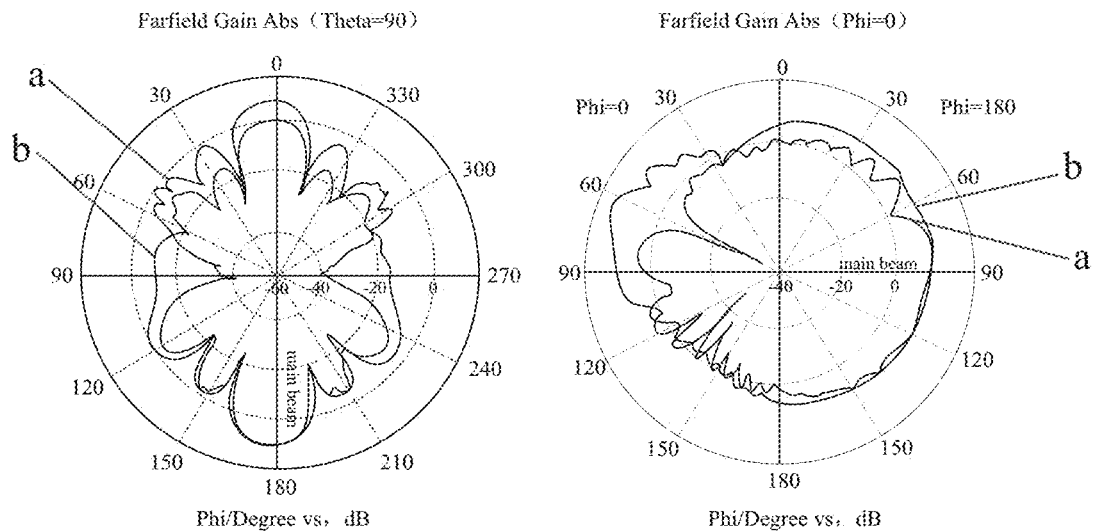
FIG. 2 is a schematic diagram showing a directional gain pattern, in accordance with some embodiments of the present disclosure.

FIG. 2 is a schematic diagram showing a directional gain pattern, in accordance with some embodiments of the present disclosure. As shown in FIG. 2, curve a represents a directional gain pattern in a case where there is no battery compartment or the battery compartment is not specially designed, and curve b represents a directional gain pattern in a case where the battery compartment is specially designed (for example, the battery compartment has a parabolic design) and is placed near the slot-family millimeter wave array antenna. Through comparison, it can be seen that a beam coverage of curve b is larger than a beam coverage of curve a in a case where Theta=90°, and the beam coverage of curve b is larger the beam coverage of curve a in a case where Phi=0°.

Optionally, the reflective curved surface is formed by a bus bar parallel to a length direction of the metal frame 1; or, the reflective curved surface is formed by a bus bar parallel to a width direction of the metal frame 1.

In this embodiment, the reflective curved surface is formed by the bus bar parallel to the length direction of the metal frame 1; or, the reflective curved surface is formed by the bus bar parallel to the width direction of the metal frame 1. In this way, multiple arrangements of the reflective curved surface are provided for the terminal device, and an appropriate arrangement can be selected for the terminal device according to actual needs.

Optionally, the reflective curved surface is a parabolic surface.

Figure 3:
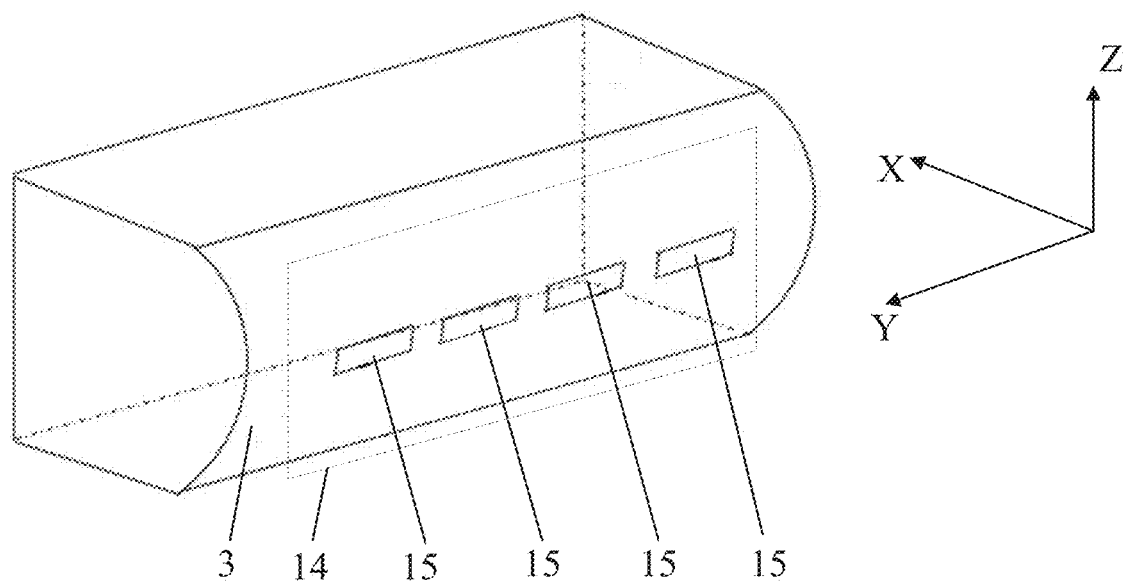
FIG. 3 is first schematic diagram showing a structure of a reflective curved surface, in accordance with some embodiments of the present disclosure.

To facilitate understanding of the description that the reflective curved surface is a parabolic surface, reference may be made to FIG. 3, which is a schematic diagram showing a structure of the reflective curved surface, in accordance with some embodiments of the present disclosure. As can be seen from FIG. 3, the fourth side 14 is shown by a dotted box, and four slots 15 are provided on the fourth side 14. Near the fourth side 14, there is a parabolic surface that is convex. The parabolic surface is a signal reflecting wall 3 formed by a metal wall of a battery compartment of the terminal device and can be used for reflecting millimeter wave signals radiated by the fourth side 14. By setting the reflective curved surface to be a parabolic surface, the directional gain pattern of the millimeter wave array antenna may be optimized.

The above arrangement can also be understood as follows. Metal at a wide side of the battery compartment is cut off along a Y axis, so that the battery compartment forms an overall reflective curved surface that is convex (which can be a parabolic surface), and a convex part of the reflective curved surface points to a slot array formed by the plurality of slots 15. The overall reflective curved surface that is convex is formed along the Y axis on an XZ plane, and the plurality of slots 15 are still located in the fourth side 14 of the metal frame 1. That is, the slot array formed by the plurality of slots 15 and the reflective curved surface that is convex are not at a same position on an X axis.

Optionally, an upper edge of the signal reflecting wall 3 is not lower than an upper edge of the slot 15, and a lower edge of the signal reflecting wall 3 is not higher than a lower edge of the slot 15.

In this embodiment, the upper edge of the signal reflecting wall 3 is not lower than the upper edge of the slot 15, and the lower edge of the signal reflecting wall 3 is not higher than the lower edge of the slot 15, therefore the signal reflecting wall 3 formed by the metal wall of the battery compartment may be able to cover the slots 15 well, which is conducive for achieving better signal reflection.

Figure 4:
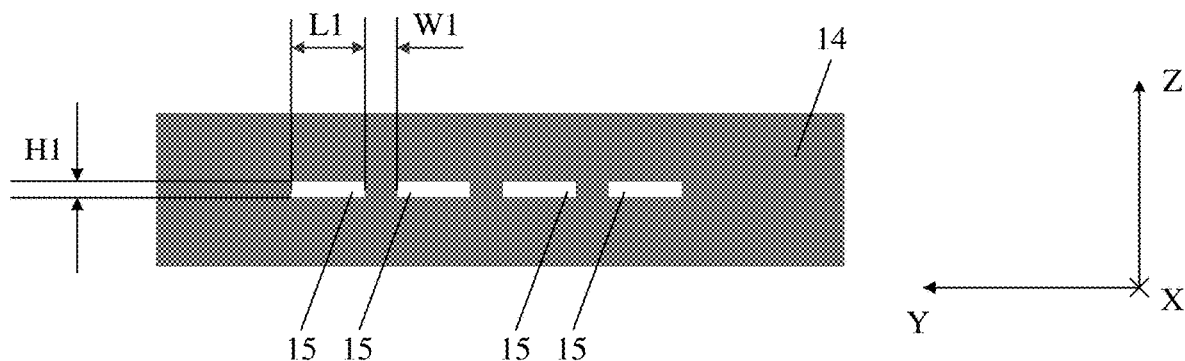
FIG. 4 is a first schematic diagram showing a structure of a side of a metal frame, in accordance with some embodiments of the present disclosure.
Figure 5:
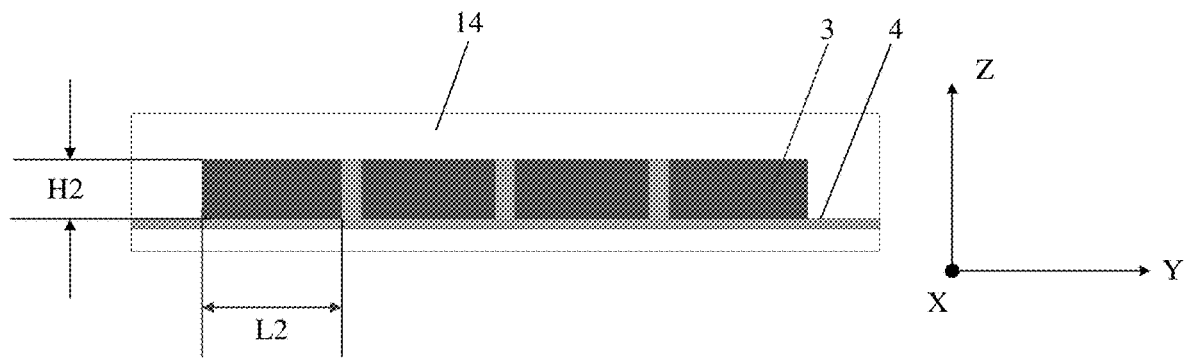
FIG. 5 is a schematic diagram showing a relative position of a signal reflecting wall and a side of a metal frame, in accordance with some embodiments of the present disclosure.

To facilitate understanding of the above arrangement, reference may be made to FIG. 4 and FIG. 5, FIG. 4 is a schematic diagram showing a structure of a side of the metal frame, in accordance with some embodiments of the present disclosure, FIG. 5 is a schematic diagram showing a relative position of a signal reflecting wall and a side of a metal frame, in accordance with some embodiments of the present disclosure.

As can be seen from FIG. 4, there are four slots 15 in the fourth side 14 of the metal frame 1. A length of a single slot 15 is L1, and L1 may be approximately half of a wavelength corresponding to a center frequency of an operating frequency range of a millimeter wave antenna. A width H1 of the slot 15 is not limited. A distance between edges of the slots 15 is W1, and the distance W1 may be determined by an isolation between two adjacent antennas and a beam scanning coverage angle of a millimeter wave array antenna. In FIG. 5, a thickness of the battery compartment is H2; the battery compartment and the slot 15 are on a same side of the ground plate 4, and H2 is greater than or equal to H1 (H2≥H1). In this way, it may be arranged that the upper edge of the signal reflecting wall 3 formed by the metal wall of the battery compartment is not lower than the upper edge of the slot 15 and that the lower edge of the signal reflecting wall 3 is not higher than the lower edge of the slot 15, so that the slots 15 may be covered well, and better signal reflection may be achieved.

Optionally, the signal reflecting wall 3 includes at least two reflective curved surfaces that are in one-to-one correspondence with positions of the slots 15.

In this embodiment, a reflective curved surface may be provided for each slot 15, so as to better reflect signals. To facilitate understanding of the above arrangement, reference may also be made to FIG. 4 and FIG. 5. In FIG. 4, the length of a single slot 15 is L1, and there are four slots 15 in the fourth side 14 of the metal frame 1. In FIG. 5, a length of a single reflective curved surface is L2, and there are four reflective curved surfaces. Therefore, each reflective curved surface corresponds to a position of a single slot 15, namely, each reflective curved surface can correspond to one slot 15 to achieve better signal reflection. Of course, the number of the reflective curved surfaces may be greater than or equal to the number of the slots 15, so as to ensure that a position of each slot 15 corresponds to one reflective curved surface.

In order to make the reflective curved surface corresponding to each slot 15 better cover the slot 15, L2 is optionally set to be greater than or equal to L1 (L2 L1). In addition, it may be arranged that the convex part of each reflective curved surface points to a corresponding slot 15, and there is a distance between the reflective surface and the slot 15.

Optionally, the at least two slots 15 are arranged along the length direction of the metal frame 1; each slot 16 is of an equal length, and any two adjacent slots 15 are spaced by an equal distance.

In this embodiment, the at least two slots 15 are arranged along the length direction of the metal frame 1; each slot 16 is of the equal length, and any two adjacent slots 15 are spaced by the equal distance. In this way, the at least two slots 15 can form a slot family, thereby achieving better radiation of millimeter wave signals.

Optionally, the distance between two adjacent slots 15 is determined by an isolation between two adjacent antennas and a beam scanning coverage angle of an millimeter wave array antenna.

In this embodiment, the distance between two adjacent slots 15 is determined by the isolation between the two adjacent antennas and the beam scanning coverage angle of the millimeter wave array antenna, so that the millimeter wave signal can be better matched for operation.

Optionally, the slot 15 includes a first sub-slot 151 and a second sub-slot 152 that intersect.

Figure 6:
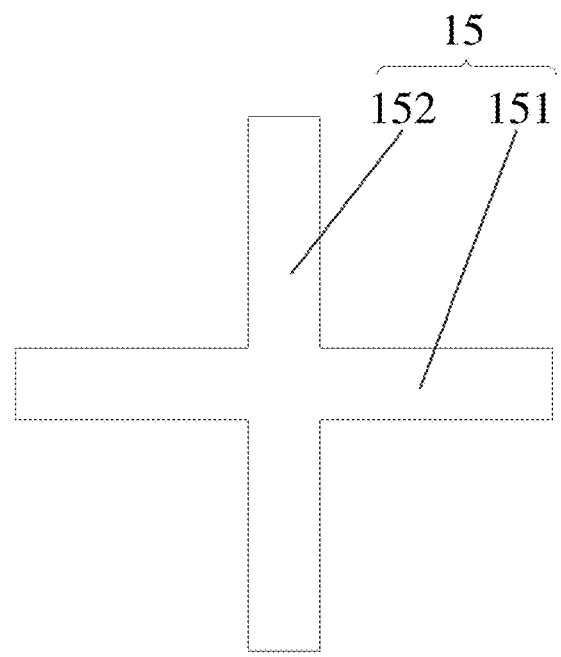
FIG. 6 is a schematic diagram showing a structure of a slot, in accordance with some embodiments of the present disclosure.

To facilitate understanding of the above arrangement, reference may be made to FIG. 6, which is a schematic diagram showing a structure of a slot, in accordance with some embodiments of the present disclosure. As can be seen from FIG. 6, the slot 15 includes a first sub-slot 151 and a second sub-slot 152 that intersect. In this way, the slot 15 may have both horizontal polarization and vertical polarization properties.

Optionally, the signal reflecting wall 3 includes a first reflective curved surface 31 that is convex and corresponds to the first sub-slot 151, and a second reflective curved surface 32 that is convex and corresponds to the second sub-slot 152; and a bus bar forming the first reflective curved surface 31 is perpendicular to a bus bar forming the second reflective curved surface 32.

Figure 7:
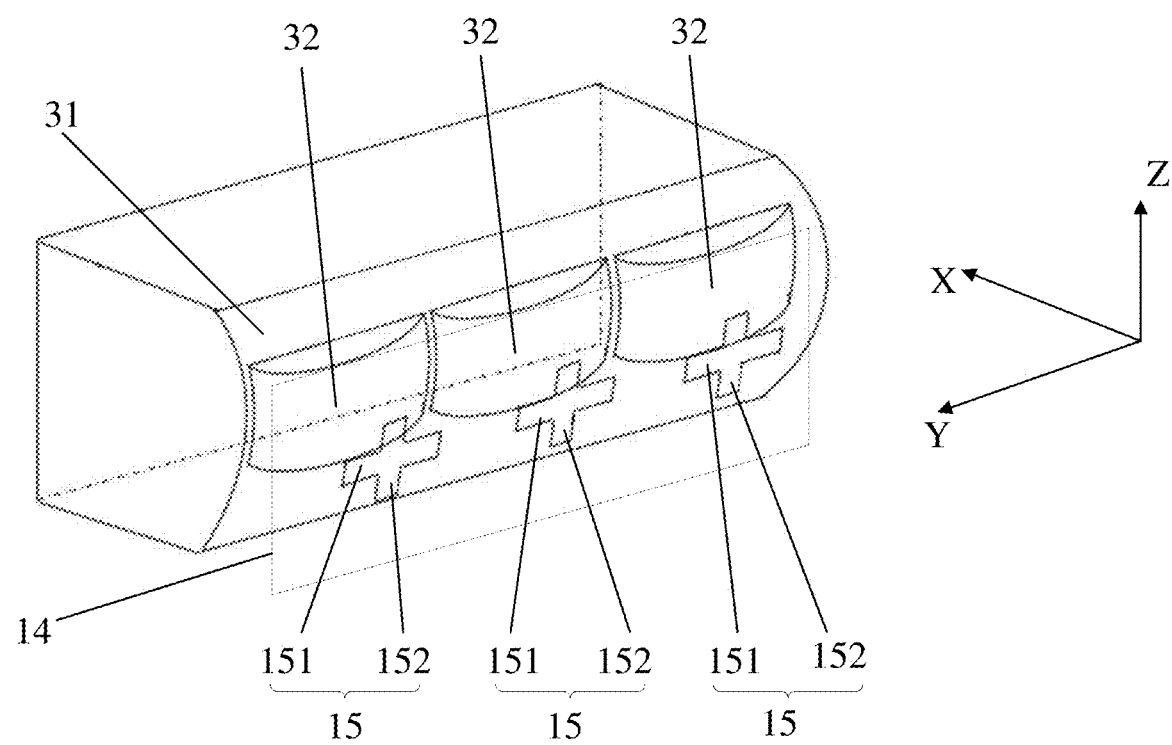
FIG. 7 is a second schematic diagram showing a structure of a reflective curved surface, in accordance with some embodiments of the present disclosure.

In this embodiment, in order to facilitate understanding of the above arrangement, reference may be made to FIG. 7, which is a schematic diagram showing a structure of a reflective curved surface, in accordance with some embodiments of the present disclosure. In FIG. 7, the fourth side 14 is shown by the dotted box, and three slots 15 are provided in the fourth side 14. Each slot includes a first sub-slot 151 and a second sub-slot 152. A reflective curved surface corresponding to the first sub-slot 151 is a first reflective curved surface 31, and the first reflective curved surface 31 is a large convex curved surface. A reflective curved surface corresponding to the second sub-slot 152 is a second reflective curved surface 32. Three second reflective curved surfaces 32 are provided on the first reflective curved surface 31. The second reflective curved surface 32 is a small convex curved surface, and each second reflective curved surface 32 corresponds to a single slot 15. The bus bar forming the first reflective curved surface 31 is perpendicular to the bus bar forming the second reflective curved surface 32.

Or, the above arrangement may be understood as follows. As shown in FIG. 7, the metal at the wide side of the battery compartment is cut off along the Y axis, so that the battery compartment forms a first reflective curved surface 31 that is convex and a plurality of second reflective curved surfaces 32 that are convex. A parabola of the first reflective curved surface 31 is formed along the Y axis on the XZ plane, and a parabola of the second reflective curved surface 32 is formed along a Z axis on an XY plane. The first reflective curved surface 31 is orthogonal to the plurality of second reflective curved surfaces 32 at 90 degrees. A plurality of slots 15 are provided in the fourth side 14 of the metal frame 1, and each slot 15 has horizontal polarization and vertical polarization properties. Convex parts of the first reflective curved surface 31 and the plurality of second reflective curved surfaces 32 point to the slot family formed by the plurality of slots 15, and the plurality of second reflective curved surfaces 32 are in one-to-one correspondence with the plurality of slots 15. The slot array formed by the plurality of slots 15 and the plurality of second reflective curved surfaces 32 are not located at the same position on the X axis (the first reflective curved surface 31 and the second reflective curved surface 32 may both be parabolic surfaces).

In this embodiment, the slot family millimeter wave array antenna has both horizontal polarization and vertical polarization properties; therefore, a wireless connection capacity may be improved. Meanwhile, the parabolic design may further improve the coverage of the main beam scanning angle.

Optionally, a long side of the first sub-slot 151 and a long side of the second sub-slot 152 intersect at a right angle.

In this embodiment, the description that the long side of the first sub-slot 151 and the long side of the second sub-slot 152 intersect at a right angle can be understood as that the first sub-slot 151 and the second sub-slot 152 are perpendicular to each other. In this way, the horizontal polarization and vertical polarization properties of the slot 15 may be further improved.

Optionally, at least two slots 15 are provided on both of two opposite sides of the metal frame 1.

Figure 9:
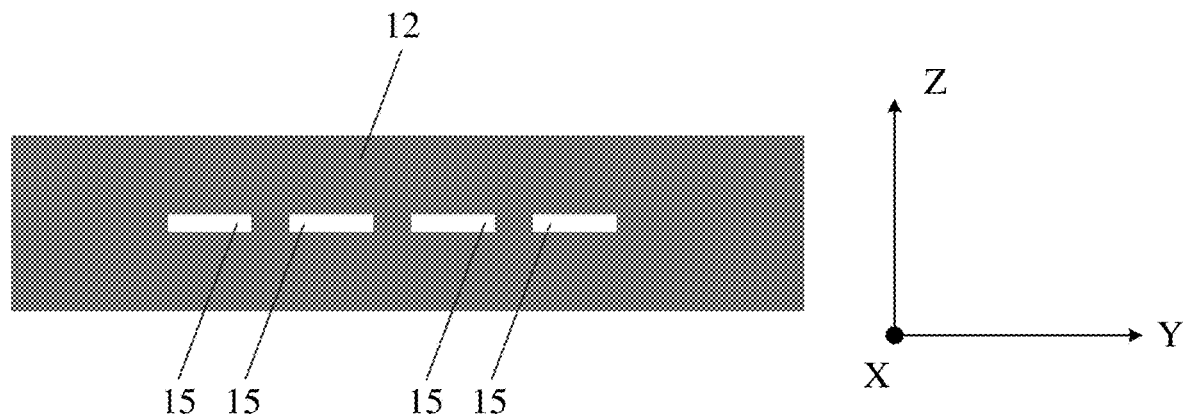
FIG. 9 is a second schematic diagram showing a structure of a side of a metal frame, in accordance with some embodiments of the present disclosure.
Figure 10:
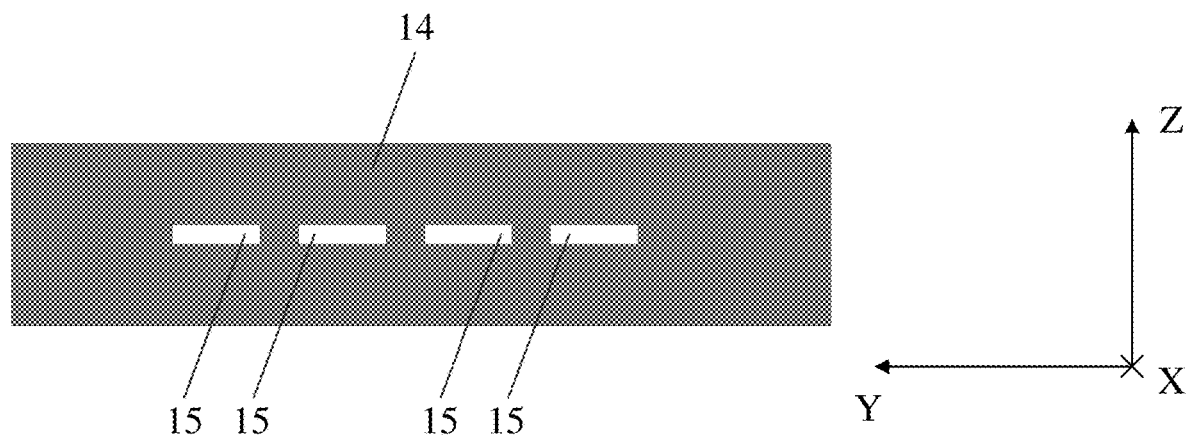
FIG. 10 is a third schematic diagram showing a structure of a side of a metal frame, in accordance with some embodiments of the present disclosure.

The two opposite sides of the metal frame 1 are both provided with at least two slots 15, and the at least two slots 15 in a same side can form a slot family. In this way, there is a slot family on both of the two opposite sides of the metal frame 1, and the beam coverage of the millimeter wave array antenna may be further improved. To facilitate understanding of the above arrangement, reference may be made to FIG. 8 to FIG. 10, which are schematic diagrams showing a structure of a terminal device, in accordance with some embodiments of the present disclosure.

Figure 8:
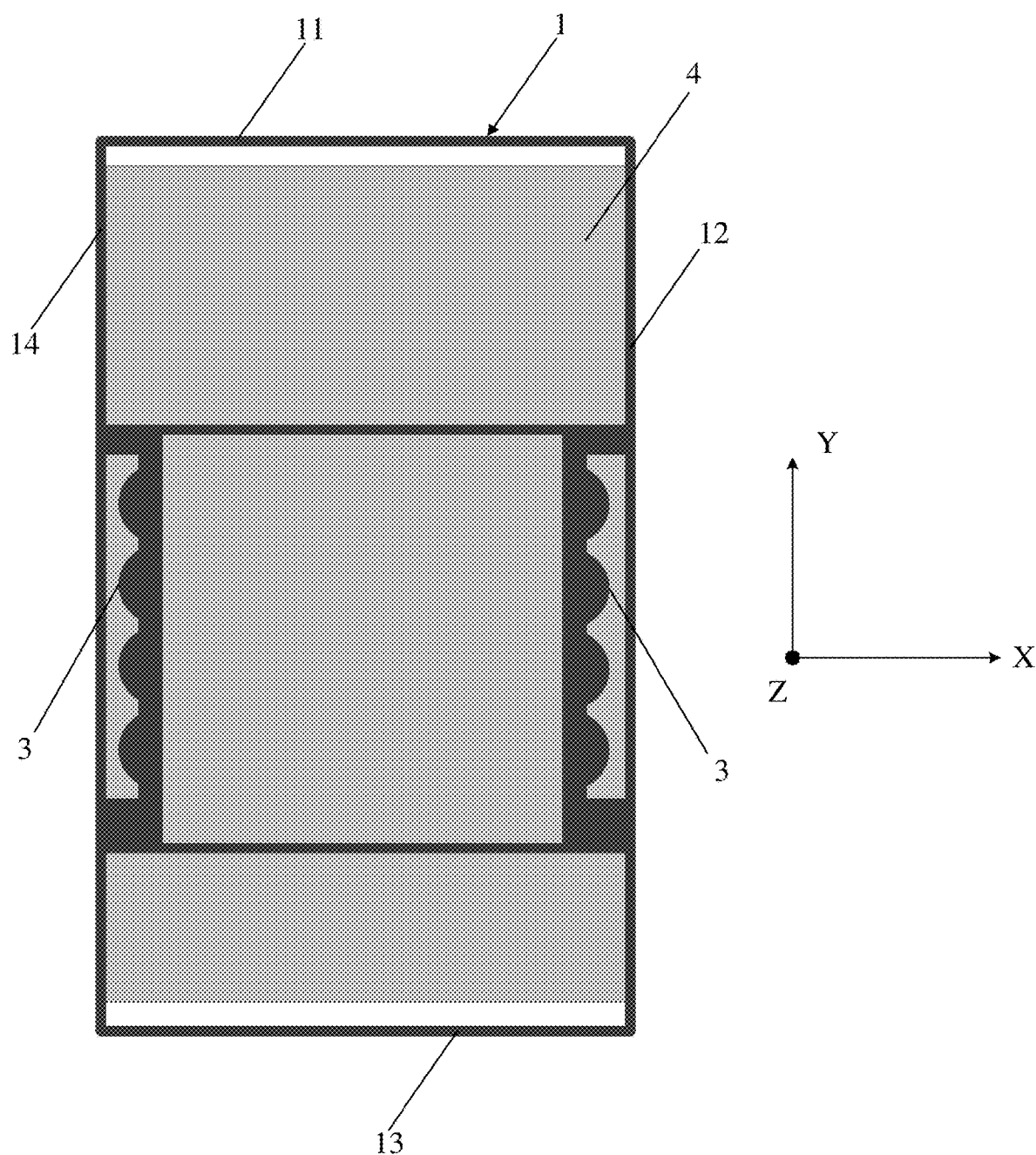
FIG. 8 is a second schematic diagram showing a structure of a terminal device, in accordance with some embodiments of the present disclosure.

As can be seen from FIG. 8, two opposite sides of the terminal device are both provided with a signal reflecting wall 3 formed by the metal wall of the battery compartment, and the signal reflecting walls 3 on both sides reflect the signals radiated on the second side 12 and the signals radiated on the fourth side 14, respectively. As can be seen from FIG. 9, four slots 15 are provided in the second side 12. As can be seen from FIG. 10, four slots 15 are provided in the fourth side 14. Thus, a main beam of the millimeter wave array antenna formed by the four slots 15 in the second side 12 points to a positive direction of the X axis, and a main beam of the millimeter wave array antenna formed by the four slots 15 in the fourth side 14 points to a negative direction of the X axis. As a result, the beam coverage of the millimeter wave array antenna may be improved.

Optionally, a length of the slot 15 is determined according to half of a wavelength corresponding to a center frequency of an operating frequency range of the antenna.

In this embodiment, the length of the slot 15 may be approximated to half of a wavelength corresponding to the center frequency of the operating frequency range of the antenna, so that the millimeter wave signal can be better matched for operation.

Optionally, the antenna feed point 2 is located at a non-central position of an inner side of the slot 15.

Figure 11:
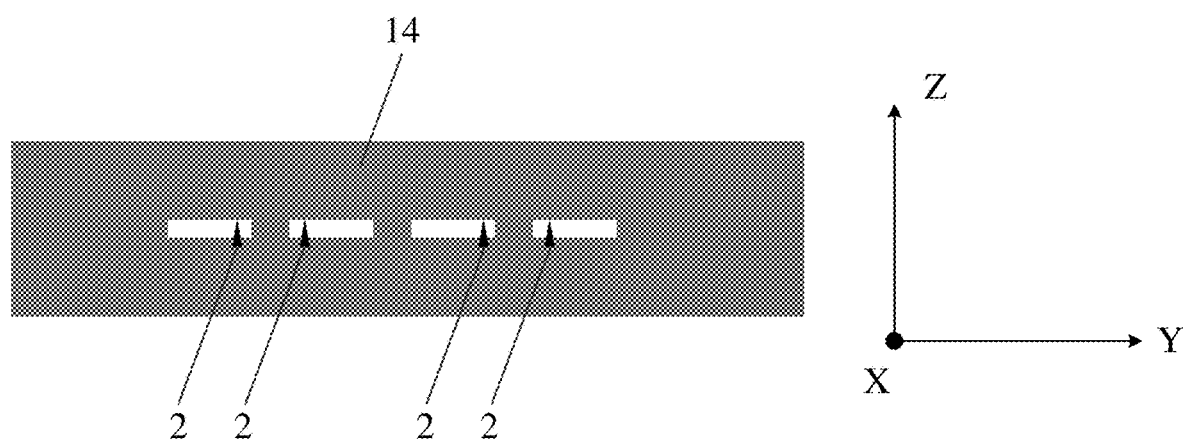
FIG. 11 is a schematic diagram showing positions of antenna feed points, in accordance with some embodiments of the disclosure.

In this embodiment, the antenna feed point 2 is located at a non-central position of an edge of the slot 15, so that the millimeter wave array antenna has better properties. To facilitate understanding of the above arrangement, reference may be made to FIG. 11, which is a schematic diagram showing a position of an antenna feed point, in accordance with some embodiments of the present disclosure. As shown in FIG. 11, there are four slots 15 in the fourth side 14; antenna feed points 2 of the first slot and the third slot from the left to the right are proximate to right ends of the slots 15, and antenna feed points 2 of the second slot and the fourth slot from the left to the right are proximate to left ends of the slots 15. With this arrangement, the millimeter wave array antenna may have better properties. Of course, this is merely an example of one arrangement of the antenna feed point 2, and there may be other arrangements in addition to this arrangement, which is not limited in this embodiment.

The terminal device provided in some embodiments of the present disclosure includes a metal frame 1. At least two slots 15 are provided in one side of the metal frame 1; at least two antenna feed points 2 are provided on an inner side wall of the metal frame 1, and different antenna feed points 2 in the at least two antenna feed points 2 are located on sides of different slots 15. The terminal device is further provided therein with a signal reflecting wall 3, and there is a gap between the signal reflecting wall 3 and the at least two slots 15. The signal reflecting wall 3 is formed by a metal wall of a battery compartment of the terminal device, and the signal reflecting wall 3 is a reflective curved surface that is convex. The battery compartment is a structure that accommodates a battery of the terminal device. The metal frame 1 and the signal reflecting wall 3 are electrically connected to a ground plate 4 in the terminal device. Therefore, the metal frame 1 provided with the slots 15 is equivalent to a millimeter wave array antenna of the terminal device, and the metal frame 1 is also a radiator of a communication antenna. In this way, it may be possible to save the accommodating space of the millimeter wave antenna, reduce the size of the terminal device, and improve support for a metal interior design. Such design may further be compatible with a solution of using an exterior metal as other antennas, thereby improving the overall competitiveness of the terminal device.

It will be noted that, the terms such as "include", "comprise" or any other variants thereof herein are intended to indicate a non-exclusive inclusion, so that a process, a method, an article or a device that includes a series of elements not only includes those elements, but also includes other elements that are not explicitly listed, or includes elements inherent to the process, the method, the article or the device. In a case where there are no more limitations, an element defined by the phrase "including/comprising a . . . " does not exclude existence of other identical elements in a process, a method, an article or a device that includes the element.

The embodiments of the present disclosure have been described in conjunction with the accompanying drawings, but the present disclosure is not limited to the specific implementations described above, which are only illustrative and not restrictive. Under the enlightenment of the present disclosure, a person of ordinary skill in the art can obtain many variations without departing from the purpose of the present disclosure and the protection scope of the claims, all of which fall within the protection of the present disclosure.

What is claimed is:

1. A terminal device, comprising
a metal frame, and at least two slots are provided in one side of the metal frame;
at least two antenna feed points provided on an inner side wall of the metal frame, and different antenna feed points in the at least two antenna feed points are located on sides of different slots;
a signal reflecting wall, and there is a gap between the signal reflecting wall and the at least two slots; the signal reflecting wall is formed by a metal wall of a battery compartment of the terminal device, and the signal reflecting wall is a reflective curved surface that is convex, wherein the battery compartment is a structure that accommodates a battery of the terminal device; and
the metal frame and the signal reflecting wall are electrically connected to a ground plate in the terminal device.

2. The terminal device according to claim 1, wherein the reflective curved surface is formed by a bus bar parallel to a length direction of the metal frame; or, the reflective curved surface is formed by a bus bar parallel to a width direction of the metal frame.

3. The terminal device according to claim 2, wherein the reflective curved surface is a parabolic surface.

4. The terminal device according to claim 1, wherein an upper edge of the signal reflecting wall is not lower than upper edge of the slots, and a lower edge of the signal reflecting wall is not higher than lower edges of the slots.

5. The terminal device according to claim 1, wherein the signal reflecting wall includes at least two reflective curved surfaces that are in one-to-one correspondence with positions of the slots.

6. The terminal device according to claim 5, wherein the at least two slots are arranged along a length direction of the metal frame; each slot is of an equal length, and any two adjacent slots are spaced by an equal distance.

7. The terminal device according to claim 6, wherein the distance between two adjacent slots is determined by an isolation between two adjacent antennas and a beam scanning coverage angle of an array antenna.

8. The terminal device according to claim 1, wherein a slot includes a first sub-slot and a second sub-slot that intersect.

9. The terminal device according to claim 8, wherein the signal reflecting wall includes a first reflective curved surface that is convex and corresponds to the first sub-slot, and a second reflective curved surface that is convex and corresponds to the second sub-slot; and a bus bar forming the first reflective curved surface is perpendicular to a bus bar forming the second reflective curved surface.

10. The terminal device according to claim 9, wherein a long side of the first sub-slot and a long side of the second sub-slot intersect at a right angle.

11. The terminal device according to claim 1, further comprising at least two slots provided in another side of the metal frame opposite the one side of the metal frame.

12. The terminal device according to claim 1, wherein a length of a slot is determined according to half of a wavelength corresponding to a center frequency of an operating frequency range of an antenna.

13. The terminal device according to claim 1, wherein an antenna feed point is located at a non-central position of an inner side of a slot.

14. The terminal device according to claim 1, wherein the metal frame is a radiator of a communication antenna.

* * * * *